US012579093B1

(12) United States Patent
Farjadrad

(10) Patent No.: US 12,579,093 B1
(45) Date of Patent: *Mar. 17, 2026

(54) CHIPLET GEARBOX FOR LOW-COST MULTI-CHIP MODULE APPLICATIONS

(71) Applicant: Eliyan Corporation, Santa Clara, CA (US)

(72) Inventor: Ramin Farjadrad, Los Altos, CA (US)

(73) Assignee: Eliyan Corp., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/736,436

(22) Filed: Jun. 6, 2024

Related U.S. Application Data

(63) Continuation-in-part of application No. 18/537,055, filed on Dec. 12, 2023, now Pat. No. 12,248,421, which is a continuation of application No. 18/092,647, filed on Jan. 3, 2023, now Pat. No. 11,841,815.

(60) Provisional application No. 63/471,484, filed on Jun. 6, 2023, provisional application No. 63/341,897, filed on May 13, 2022, provisional application No. 63/296,162, filed on Jan. 4, 2022, provisional application No. 63/295,524, filed on Dec. 31, 2021.

(51) Int. Cl.
| | |
|---|---|
| *H03M 13/00* | (2006.01) |
| *G06F 13/40* | (2006.01) |
| *H03M 13/15* | (2006.01) |

(52) U.S. Cl.
CPC .... *G06F 13/4027* (2013.01); *H03M 13/1515* (2013.01); *H03M 13/615* (2013.01)

(58) Field of Classification Search
None
See application file for complete search history.

(56) References Cited

U.S. PATENT DOCUMENTS

| | | | |
|---|---|---|---|
| 4,334,305 | A | 6/1982 | Girardi |
| 5,396,581 | A | 3/1995 | Mashiko |
| 5,677,569 | A | 10/1997 | Choi |
| 5,892,287 | A | 4/1999 | Hoffman |
| 5,910,010 | A | 6/1999 | Nishizawa |
| 6,031,729 | A | 2/2000 | Berkely |
| 6,055,235 | A | 4/2000 | Blanc |

(Continued)

OTHER PUBLICATIONS

"Hot Chips 2017: Intel Deep Dives Into EMIB", TomsHardware.com; Aug. 25, 2017.

(Continued)

*Primary Examiner* — Mujtaba M Chaudry
(74) *Attorney, Agent, or Firm* — Lance Kreisman; Peninsula Patent Group

(57) ABSTRACT

A multi-chip module (MCM) includes a first integrated circuit (IC) chip including a first interface defining a first number of interface contacts. Conversion circuitry receives a first set of information-carrying signals associated with a memory access operation. Conversion circuitry generates a second set of non-information-carrying signals associated with the memory access operation and aggregates the second set of non-information-carrying signals with the first set of information-carrying signals to generate an aggregate set of signals. A second interface transmits the aggregate set of signals. Memory, including a memory interface coupled to the second interface of the first IC chiplet, receives the aggregate set of signals.

20 Claims, 15 Drawing Sheets

(56) References Cited

U.S. PATENT DOCUMENTS

| | | | |
|---|---|---|---|
| 6,417,737 B1 | 7/2002 | Moloudi | |
| 6,690,742 B2 | 2/2004 | Chan | |
| 6,721,313 B1 | 4/2004 | Van Duyne | |
| 6,932,618 B1 | 8/2005 | Nelson | |
| 7,027,529 B1 | 4/2006 | Ohishi | |
| 7,248,890 B1 | 7/2007 | Raghavan | |
| 7,269,212 B1 | 9/2007 | Chau | |
| 7,477,615 B2 | 1/2009 | Oshita | |
| 7,535,958 B2 | 5/2009 | Best | |
| 7,701,957 B1* | 4/2010 | Bicknell | H04L 12/4625 |
| | | | 370/467 |
| 7,907,469 B2 | 3/2011 | Sohn et al. | |
| 7,978,754 B2 | 7/2011 | Yeung | |
| 8,004,330 B1 | 8/2011 | Acimovic | |
| 8,024,142 B1 | 9/2011 | Gagnon | |
| 8,121,541 B2 | 2/2012 | Rofougaran | |
| 8,176,238 B2 | 5/2012 | Yu et al. | |
| 8,483,579 B2 | 7/2013 | Fukuda | |
| 8,546,955 B1 | 10/2013 | Wu | |
| 8,704,364 B2 | 4/2014 | Banijamali et al. | |
| 8,861,573 B2 | 10/2014 | Chu | |
| 8,948,203 B1 | 2/2015 | Nolan | |
| 8,982,905 B2 | 3/2015 | Kamble | |
| 9,088,334 B2 | 7/2015 | Chakraborty | |
| 9,106,229 B1 | 8/2015 | Hutton | |
| 9,129,935 B1 | 9/2015 | Chandrasekar | |
| 9,294,313 B2 | 3/2016 | Prokop | |
| 9,349,707 B1 | 5/2016 | Sun | |
| 9,379,878 B1 | 6/2016 | Lugthart | |
| 9,432,298 B1 | 8/2016 | Smith | |
| 9,832,006 B1 | 11/2017 | Bandi | |
| 9,843,538 B2 | 12/2017 | Woodruff | |
| 9,886,275 B1 | 2/2018 | Carlson | |
| 9,934,842 B2 | 4/2018 | Mozak | |
| 9,961,812 B2 | 5/2018 | Suorsa | |
| 10,171,115 B1 | 1/2019 | Shirinfar | |
| 10,402,363 B2 | 9/2019 | Long et al. | |
| 10,410,694 B1 | 9/2019 | Arbel | |
| 10,439,661 B1 | 10/2019 | Heydari | |
| 10,642,767 B1 | 5/2020 | Farjadrad | |
| 10,678,738 B2 | 6/2020 | Dai | |
| 10,735,176 B1 | 8/2020 | Heydari | |
| 10,748,852 B1 | 8/2020 | Sauter | |
| 10,769,073 B2 | 9/2020 | Desai | |
| 10,803,548 B2 | 10/2020 | Matam et al. | |
| 10,804,204 B2 | 10/2020 | Rubin et al. | |
| 10,826,536 B1 | 11/2020 | Beukema | |
| 10,855,498 B1 | 12/2020 | Farjadrad | |
| 10,935,593 B2 | 3/2021 | Goyal | |
| 11,088,876 B1 | 8/2021 | Farjadrad | |
| 11,100,028 B1* | 8/2021 | Subramaniam | G06F 13/4221 |
| 11,164,817 B2 | 11/2021 | Rubin et al. | |
| 11,204,863 B2 | 12/2021 | Sheffler | |
| 11,782,865 B1 | 10/2023 | Kochavi | |
| 11,789,649 B2 | 10/2023 | Chatterjee et al. | |
| 11,841,815 B1 | 12/2023 | Farjadrad | |
| 11,842,986 B1 | 12/2023 | Ramin | |
| 11,855,043 B1 | 12/2023 | Farjadrad | |
| 11,855,056 B1 | 12/2023 | Rad | |
| 11,892,242 B2 | 2/2024 | Mao | |
| 11,893,242 B1 | 2/2024 | Farjadrad | |
| 11,983,125 B2 | 5/2024 | Soni | |
| 12,001,355 B1 | 6/2024 | Dreier | |
| 12,001,725 B2 | 6/2024 | Chatterjee | |
| 2002/0122479 A1 | 9/2002 | Agazzi | |
| 2002/0136315 A1 | 9/2002 | Chan | |
| 2004/0088444 A1 | 5/2004 | Baumer | |
| 2004/0113239 A1 | 6/2004 | Prokofiev | |
| 2004/0130347 A1 | 7/2004 | Moll | |
| 2004/0156461 A1 | 8/2004 | Agazzi | |
| 2005/0041683 A1 | 2/2005 | Kizer | |
| 2005/0134306 A1 | 6/2005 | Stojanovic | |
| 2005/0157781 A1 | 7/2005 | Ho | |
| 2005/0205983 A1 | 9/2005 | Origasa | |
| 2006/0060376 A1 | 3/2006 | Yoon | |
| 2006/0103011 A1 | 5/2006 | Andry | |
| 2006/0158229 A1 | 7/2006 | Hsu | |
| 2006/0181283 A1 | 8/2006 | Wajcer | |
| 2006/0188043 A1 | 8/2006 | Zerbe | |
| 2006/0250985 A1 | 11/2006 | Baumer | |
| 2006/0251194 A1 | 11/2006 | Bublil | |
| 2007/0281643 A1 | 12/2007 | Kawai | |
| 2008/0063395 A1 | 3/2008 | Royle | |
| 2008/0086282 A1 | 4/2008 | Artman | |
| 2008/0143422 A1 | 6/2008 | Lalithambika | |
| 2008/0186987 A1 | 8/2008 | Baumer | |
| 2008/0222407 A1 | 9/2008 | Carpenter | |
| 2009/0113158 A1 | 4/2009 | Schnell | |
| 2009/0154365 A1 | 6/2009 | Diab | |
| 2009/0174448 A1 | 7/2009 | Zabinski | |
| 2009/0220240 A1 | 9/2009 | Abhari | |
| 2009/0225900 A1 | 9/2009 | Yamaguchi | |
| 2009/0304054 A1 | 12/2009 | Tonietto | |
| 2010/0177841 A1 | 7/2010 | Yoon | |
| 2010/0197231 A1 | 8/2010 | Kenington | |
| 2010/0294547 A1 | 11/2010 | Hatanaka | |
| 2011/0029803 A1 | 2/2011 | Redman-White | |
| 2011/0038286 A1 | 2/2011 | Ta | |
| 2011/0167297 A1 | 7/2011 | Su | |
| 2011/0187430 A1 | 8/2011 | Tang | |
| 2011/0204428 A1 | 8/2011 | Erickson | |
| 2011/0267073 A1 | 11/2011 | Chengson | |
| 2011/0293041 A1 | 12/2011 | Luo | |
| 2012/0082194 A1 | 4/2012 | Tam | |
| 2012/0182776 A1 | 7/2012 | Best | |
| 2012/0192023 A1 | 7/2012 | Lee | |
| 2012/0216084 A1 | 8/2012 | Chun | |
| 2012/0327818 A1 | 12/2012 | Takatori | |
| 2013/0181257 A1 | 7/2013 | Ngai | |
| 2013/0222026 A1 | 8/2013 | Havens | |
| 2013/0249290 A1 | 9/2013 | Buonpane | |
| 2013/0285584 A1 | 10/2013 | Kim | |
| 2014/0016524 A1 | 1/2014 | Choi | |
| 2014/0048947 A1 | 2/2014 | Lee | |
| 2014/0126613 A1 | 5/2014 | Zhang | |
| 2014/0192583 A1 | 7/2014 | Rajan | |
| 2014/0269860 A1 | 9/2014 | Brown | |
| 2014/0269983 A1 | 9/2014 | Baeckler | |
| 2015/0012677 A1 | 1/2015 | Nagarajan | |
| 2015/0046612 A1 | 2/2015 | Gupta | |
| 2015/0172040 A1 | 6/2015 | Pelekhaty | |
| 2015/0180760 A1 | 6/2015 | Rickard | |
| 2015/0206867 A1 | 7/2015 | Lim | |
| 2015/0271074 A1 | 9/2015 | Hirth | |
| 2015/0326348 A1 | 11/2015 | Shen | |
| 2015/0358005 A1 | 12/2015 | Chen | |
| 2016/0056125 A1 | 2/2016 | Pan | |
| 2016/0071818 A1 | 3/2016 | Wang | |
| 2016/0111406 A1 | 4/2016 | Mak | |
| 2016/0217872 A1 | 7/2016 | Hossain | |
| 2016/0294585 A1 | 10/2016 | Rahman | |
| 2017/0255575 A1 | 9/2017 | Niu | |
| 2017/0286340 A1 | 10/2017 | Ngo | |
| 2017/0317859 A1 | 11/2017 | Hormati | |
| 2017/0331651 A1 | 11/2017 | Suzuki | |
| 2018/0010329 A1 | 1/2018 | Golding, Jr. | |
| 2018/0082981 A1 | 3/2018 | Gowda | |
| 2018/0137005 A1 | 5/2018 | Wu | |
| 2018/0175001 A1 | 6/2018 | Pyo | |
| 2018/0190635 A1 | 7/2018 | Choi | |
| 2018/0196767 A1 | 7/2018 | Linstadt | |
| 2018/0210830 A1 | 7/2018 | Malladi et al. | |
| 2018/0315735 A1 | 11/2018 | Delacruz | |
| 2019/0044764 A1 | 2/2019 | Hollis | |
| 2019/0058457 A1 | 2/2019 | Ran | |
| 2019/0108111 A1 | 4/2019 | Levin | |
| 2019/0198489 A1 | 6/2019 | Kim | |
| 2019/0267062 A1 | 8/2019 | Tan | |
| 2019/0319626 A1 | 10/2019 | Dabral | |
| 2020/0051961 A1 | 2/2020 | Rickard | |
| 2020/0105718 A1 | 4/2020 | Collins et al. | |
| 2020/0257619 A1 | 8/2020 | Sheffler | |
| 2020/0320026 A1 | 10/2020 | Kabiry | |
| 2020/0364142 A1 | 11/2020 | Lin | |

(56) References Cited

U.S. PATENT DOCUMENTS

| | | | | |
|---|---|---|---|---|
| 2020/0373286 A1* | 11/2020 | Dennis | .................... | H01L 24/32 |
| 2021/0056058 A1 | 2/2021 | Lee | | |
| 2021/0082875 A1 | 3/2021 | Nelson | | |
| 2021/0117102 A1 | 4/2021 | Grenier | | |
| 2021/0149763 A1 | 5/2021 | Ranganathan | | |
| 2021/0181974 A1 | 6/2021 | Ghosh | | |
| 2021/0183842 A1 | 6/2021 | Fay | | |
| 2021/0193567 A1 | 6/2021 | Cheah et al. | | |
| 2021/0225827 A1 | 7/2021 | Lanka | | |
| 2021/0258078 A1* | 8/2021 | Meade | ............... | G11C 11/4096 |
| 2021/0311900 A1 | 10/2021 | Malladi | | |
| 2021/0365203 A1 | 11/2021 | O | | |
| 2021/0405919 A1 | 12/2021 | K | | |
| 2022/0051989 A1 | 2/2022 | Agarwal | | |
| 2022/0159860 A1 | 5/2022 | Winzer | | |
| 2022/0189934 A1 | 6/2022 | Kim | | |
| 2022/0223522 A1 | 7/2022 | Scearce | | |
| 2022/0254390 A1* | 8/2022 | Gans | ..................... | H03K 19/20 |
| 2022/0350756 A1 | 11/2022 | Burstein | | |
| 2022/0391114 A1 | 12/2022 | Richter | | |
| 2023/0039033 A1* | 2/2023 | Zarkovsky | ............. | H04B 10/67 |
| 2023/0068802 A1 | 3/2023 | Wang | | |
| 2023/0090061 A1* | 3/2023 | Zarkovsky | ......... | H04B 10/6151 |
| | | | | 398/152 |
| 2023/0092541 A1 | 3/2023 | Dugast | | |
| 2023/0161599 A1 | 5/2023 | Erickson | | |
| 2023/0181599 A1 | 6/2023 | Du et al. | | |
| 2023/0289311 A1 | 9/2023 | Noguera Serra | | |
| 2024/0007234 A1 | 1/2024 | Harrington | | |
| 2024/0028208 A1 | 1/2024 | Kim | | |
| 2024/0241840 A1 | 7/2024 | Im | | |

OTHER PUBLICATIONS

"Using Chiplet Encapsulation Technology to Achieve Processing-In-Memory Functions"; Micromachines 2022, 13, 1790; https://www.mdpi.com/journal/micromachines; Tian et al.

"Multiport memory for high-speed interprocessor communication in MultiCom;" Scientia Iranica, vol. 8, No. 4, pp. 322-331; Sharif University of Technology, Oct. 2001; Asgari et al.

Universal Chiplet Interconnect Express (UCIe) Specification, Revision 1.1, Version 1.0, Jul. 10, 2023.

Hybrid Memory Cube Specification 2.1, Hybrid Memory Cube Consortium, HMC-30G-VSR PHY, 2014.

Farjadrad et al., "A Bunch of Wires (B0W) Interface for Inter-Chiplet Communication", 2019 IEEE Symposium on High-Performance Interconnects (HOTI), pp. 27-30, Oct. 2019.

Universal Chiplet Interconnect Express (UCIe) Specification Rev. 1.0, Feb. 24, 2022.

Brinda Ganesh et. al., "Fully-Buffered DIMM Memory Architectures: Understanding Mechanisms, Overheads and Scaling", 2007, IEEE, 2007 IEEE 13th International Symposium on High Performance Computer Architecture, pp. 1-12 (Year: 2007).

Anu Ramamurthy, "Chiplet Technology & Heterogeneous Integration" Jun. 2021, NASA, 2021 NEPP ETW, slides 1-17 (Year: 2021).

Wikipedia, "Printed circuit board", Nov. 9, 2021, Wayback Machine, as preserved by the Internet Archive on Nov. 9, 2021, pp. 1-23 (Year: 2021).

U.S. Appl. No. 16/812,234; Mohsen F. Rad; filed Mar. 6, 2020.

Block Memory Generator v8.2 LogiCORE IP Product Guide Vivado Design Suite; Xilinx; Apr. 1, 2015.

Kurt Lender et al., "Questions from the Compute Express Link Exploring Coherent Memory and Innovative Cases Webinar", Apr. 13, 2020, CXL consortium.

Planet Analog, "The basics of SerDes (serializers/deserializers) for interfacing", Dec. 1, 2020, Planet Analog.

* cited by examiner

Figure 1:
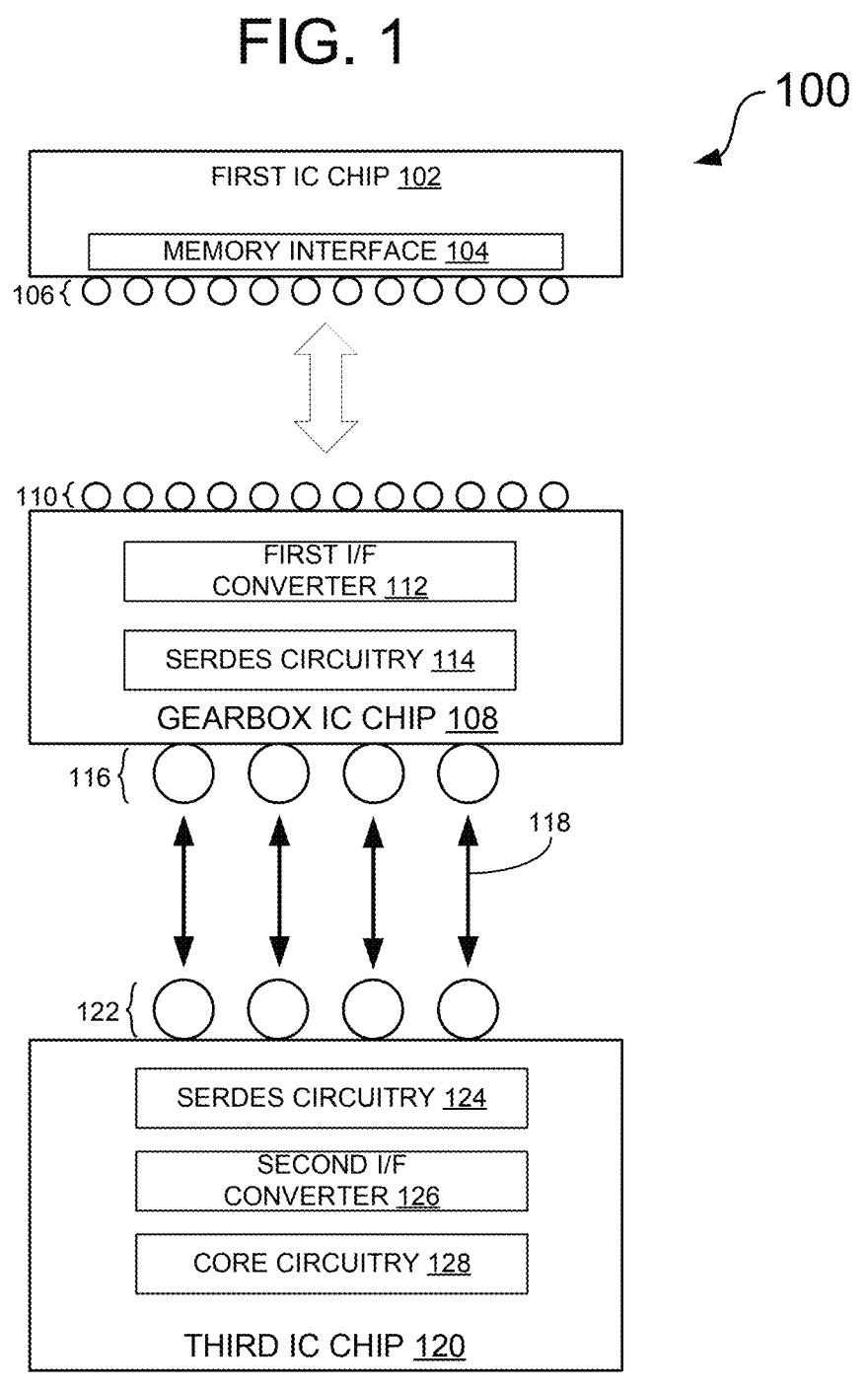

FIRST IC CHIP 102

MEMORY INTERFACE 104

106 {

110 {

FIRST I/F
CONVERTER 112

SERDES CIRCUITRY 114

GEARBOX IC CHIP 108

116 {

118

122 {

SERDES CIRCUITRY 124

SECOND I/F
CONVERTER 126

CORE CIRCUITRY 128

THIRD IC CHIP 120

FIG. 2

| Function | Number of Microbumps | Signal ID/Number of Bits |
|---|---|---|
| Data | 64 | DQ[63:0] |
| Column Command/ Address | 8 | C[7:0] |
| Row Command/ Address | 10 | R[9:0] |
| DBI | 8 | 1DB per 8 DQs |
| ECC | 4 | 2 ECC per 32 DQs |
| SEV | 4 | 2 SEV per 32 DQs |
| DPAR | 2 | 1 PAR per 32 DQs |
| APAR | 1 | 1 PAR per AWORD |
| DERR | 2 | 1 DERR per 32 DQs, or 1 per 64 bits if FEC used |
| Strobe | 8 | 1 RDQS_t/RDQS_c, WDQS_t/WDQS_c per 32 DQs |
| Clock | 2 | CK_t/CK_c |
| AERR | 1 | AERR per AWORD |
| Data or Add Identifier | 1 | |
| Redundant Data | 4 | RD[3:0] |
| Redundant Address | 1 | Redundant Row/Column |
| RFU | 1 | 1 RFU per AWORD |
| Total | 120 | |

FIG. 3

(SIGNALS TO/FROM FIRST IC CHIP 102)

(SIGNALS TO/FROM THIRD IC CHIP 120)

FIRST I/F CONVERTER 112

GEARBOX IC CHIP (SIGNALS TO/FROM GEARBOX IC CHIP 108)

FIG. 6

| Function | Number of Microbumps | Signal ID/Number of Bits | Signal Direction (In/Out) |
|---|---|---|---|
| Data | 64 | DQ[63:0] | IO |
| Column Command/ Address | 8 | C[7:0] | I |
| Row Command/ Address | 10 | R[9:0] | I |
| DBI | 8 | 1DB per 8 DQs | |
| ECC | 4 | 2 ECC per 32 DQs | IO |
| SEV | 4 | 2 SEV per 32 DQs | IO |
| DPAR | 2 | 1 PAR per 32 DQs | IO |
| APAR | 1 | 1 PAR per AWORD | I |
| DERR | 2 | 1 DERR per 32 DQs, or 1 per 64 bits if FEC used | O |
| Strobe | 8 | 1 RDQS_t/RDQS_c, WDQS_t/WDQS_c per 32 DQs | IO |
| Clock | 2 | CK_t/CK_c | |
| AERR | 1 | AERR per AWORD | O |
| Data or Add Identifier | 1 | RD[3:0] | |
| Redundant Data | 4 | Redundant Row/Column | |
| Redundant Address | 1 | | |
| RFU | 1 | 1 RFU per AWORD | |
| Total | 120 | | |

Figure 10:
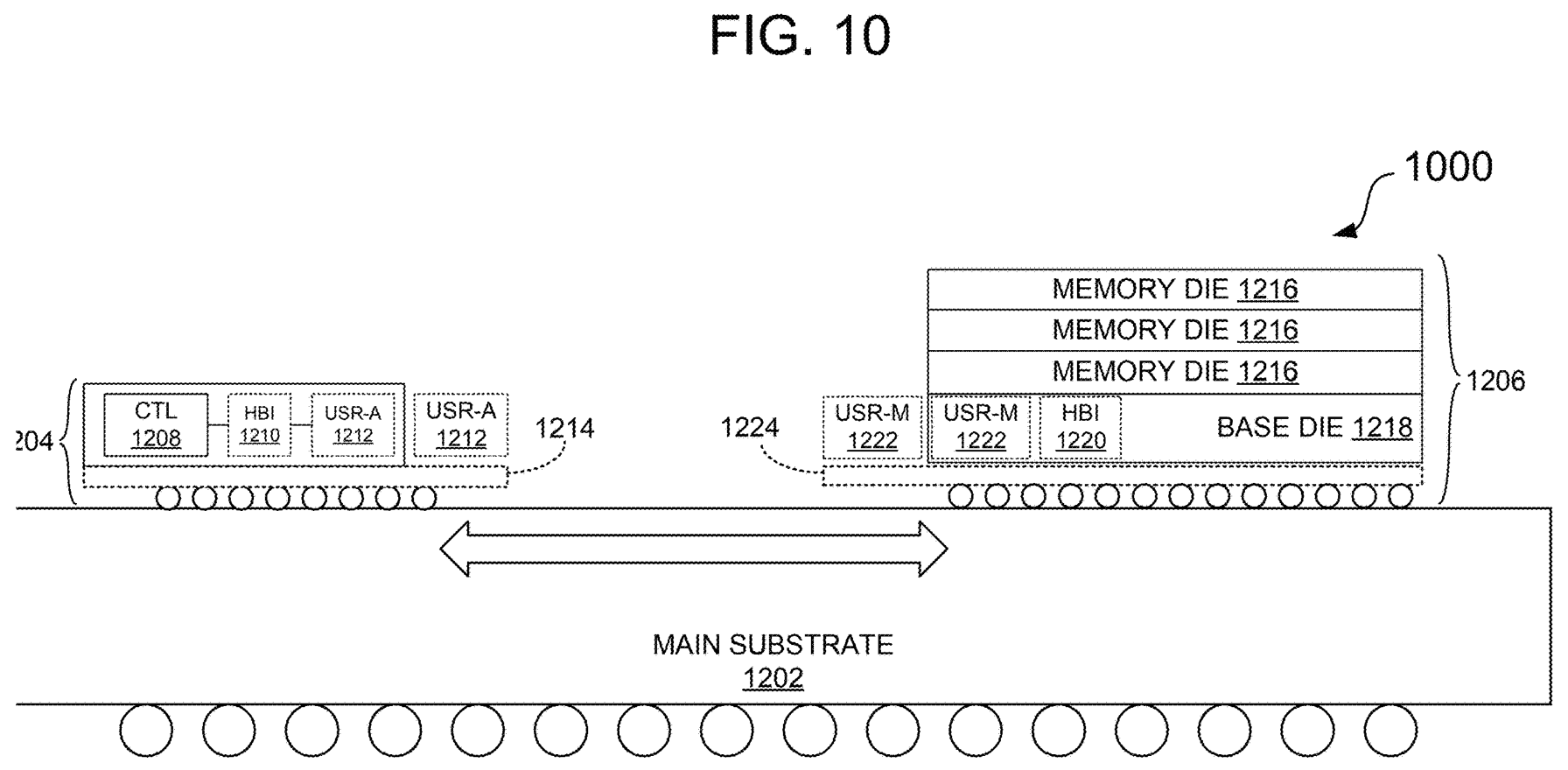

MEMORY DIE 1216

MEMORY DIE 1216

MEMORY DIE 1216

BASE DIE 1218

HBI 1220

USR-M 1222

USR-M 1222

1224

USR-A 1212

1214

USR-A 1212

CTL 1208

HBI 1210

MAIN SUBSTRATE 1202

Figure 11:
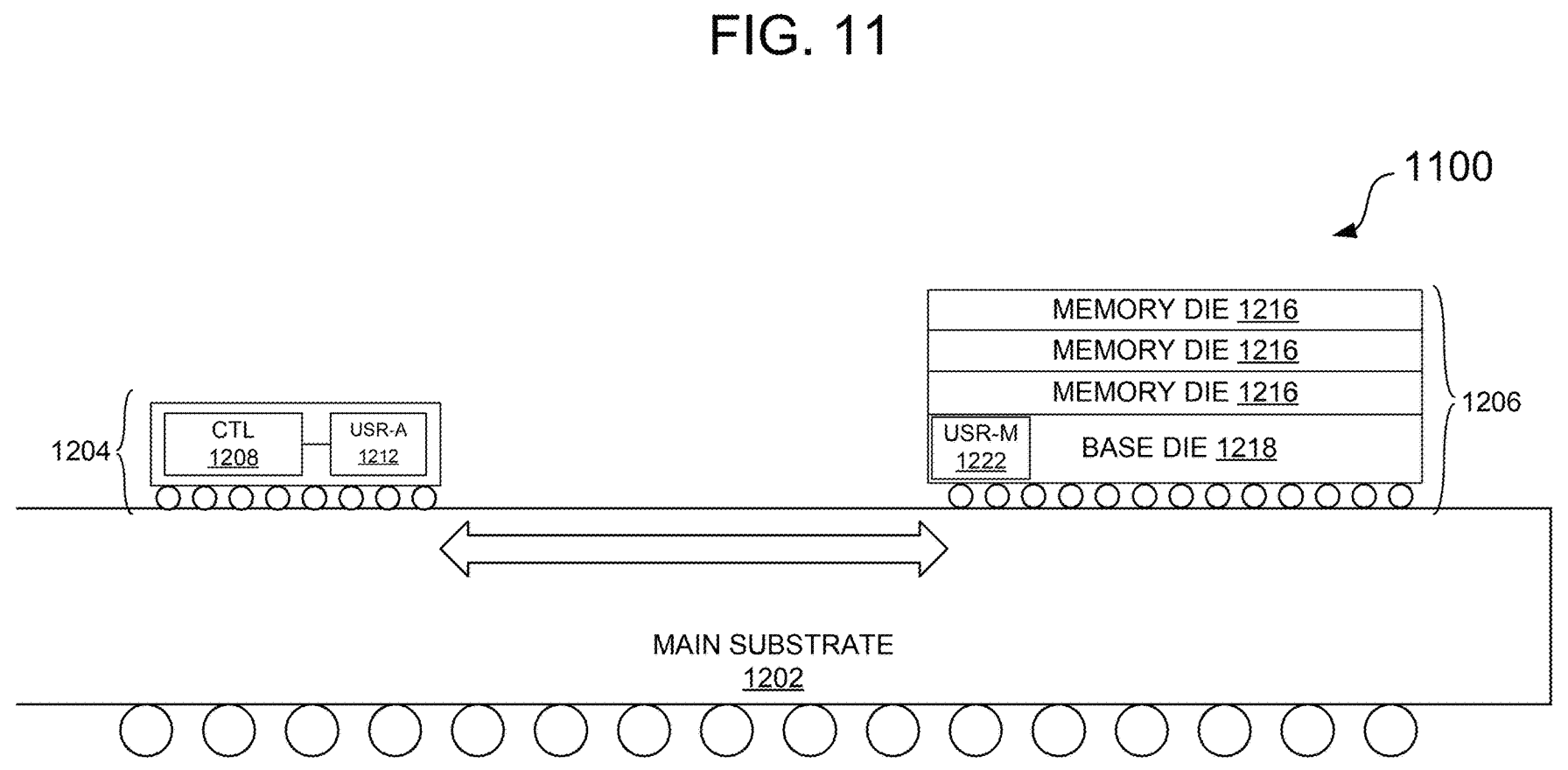

MEMORY DIE 1216
MEMORY DIE 1216
MEMORY DIE 1216
BASE DIE 1218

USR-M 1222

MAIN SUBSTRATE 1202

USR-A 1212

CTL 1208

| HBM3 Signals | Input/Output | HBM3a Bw=8.2Tbps | NuLink3 Bw=8.2Tbps | NuLink3 data rate | |
|---|---|---|---|---|---|
| Read Data (DQ) | In/Out | 64 | 16 | 32G | |
| Write Data (DQ) | In/Out | 20 | 5 | 16G | |
| Cmd/Add (Column/Row)=18bits, APAR=2bits * | Input | 8 | NA | NA | |
| DBI | In/Out | 6 | 2 | 32G | |
| ECC/DPAR ((2+1) bits per sub channel) | Output | 4 | 1 | 32G | |
| SEV | Output | 2 | 1 | 32G | |
| DERR | Output | 1 | 1 | | |
| AERR | Input | 2 | 2 | | |
| Clock | Input | 8 | NA | 16GHz | Clock runs from the Master side to Slave side |
| Strobes | | 4 | NA | | |
| RD/WR & WDQS(G) per 32 DQs | | 1 | NA | | |
| Redundant Data | | NA | NA | | |
| Redundant Address | | NA | NA | | |
| Track/Sideband | | NA | 1 | | Track signal runs from Slave to Master for Master Rx tracking. Sideband runs bidirectional low-speed |
| Total Channel Signal bumps | | 120 | 28 | | |
| Total PHY Signal bumps | | 1920 | 448 | | |
| IEEE 1500 | | 52 | 4 | | IEEE 1500 can also be used as sideband signals for all lanes running in both direction. |
| Total PHY Signal/IEEE1500 bumps | | | 452 | | |
| Total PHY Signal/IEEE1500/Power bumps | | | 678 | | |
| Beachfront (mm) w/ Package stackup 8-2-8 | | | 7.35 | | NuLink IP depth=1.5mm |
| bump pitch(um)= | | | 130 | | |
| Beachfront (mm) w/ Package stackup 10-2-10 | | | 5.88 | | NuLink IP depth=1.85mm (single staggered) |
| bump pitch(um)= | | | 130 | | |

*HBM3: APAR=2bits

FIG. 15

| HBM4 Signals | Input/Output | HBM4 8TB/s 4Tbps 2 x HBM4 Ports | Nulink 8TX->16 4Tbps | Nulink data rate | |
|---|---|---|---|---|---|
| | | 1504 | | | |
| Read Data (DQ) | In/Out | 128 | 32 | 32G | |
| Write Data (DQ) | In/Out | | | 32G | |
| Cmd/Add (Column/Row)=18bits, AFAR=4bits* | Input | 30 | 5 | 32G | CMD/Address/AFAR run at twice the HBM3 CMD/Address/AFAR rates to be shared among 2 channels |
| DBI | In/Out | 16 | NA | NA | |
| ECC/DPAR (12+1 bits per sub channel) | In/Out | 32 | 4 | 32G | |
| SEV | Output | 8 | 2 | 32G | |
| DERR | Output | 4 | 1 | 32G | |
| AERR | Output | 2 | 1 | 32G | |
| Clock | Input | 2 | 2 | 16GHz | Clock runs from the Master side to Slave side |
| Strobes | Input | 16 | NA | | |
| Register & Window/61 per 32 DQs | | 8 | NA | | |
| Redundant Data | | 2 | NA | | |
| Redundant Address | | NA | NA | | Track signal runs from Slave to Master for Master Rx tracking. Sideband runs bidirectional low speed |
| Track/Sideband | | NA | 1 | | |
| Total Channel Signal bumps | | 238 | 49 | | |
| Total PHY Signal bumps | | 3808 | 768 | | |
| IEEE 1500 | | 48 | 4 | | IEEE 1500 can also be used as sideband signals for all lanes running in both direction |
| Total PHY Signal/IEEE1500 bumps | | | 772 | | |
| Total PHY Signal/IEEE1500/Power bumps | | | 1158 | | |
| Beachfront (mm) w/ Package stackup 8-2-8 | bump pitch(um)= | | 10.04 | 130 | Nulink IP depth~1.5mm (double staggered 110um->104um) |
| Beachfront (mm) w/ Package stackup 10-2-10 | bump pitch(um)= | | 10.04 | 130 | Nulink IP depth~1.85mm (single staggered) |
| Beachfront (mm) w/ Package stackup 10-2-10 | bump pitch(um)= | | 8.03 | 110 | Nulink IP depth~1.5mm (double staggered 110um->104um) |

1502   1504

*HBM4: AFAR=4bits or 48bits for Cmd/Add -> 2x8S(8,6,3)

CHIPLET GEARBOX FOR LOW-COST MULTI-CHIP MODULE APPLICATIONS

CROSS-REFERENCE TO RELATED APPLICATIONS

This application claims priority to U.S. Provisional Application No. 63/471,484, filed Jun. 6, 2023, entitled CHIPLET GEARBOX FOR LOW-COST MULTI-CHIP MODULE APPLICATIONS, and is a Continuation-In-Part of U.S. patent application Ser. No. 18/537,055, filed Dec. 12, 2023, entitled CHIPLET GEARBOX FOR LOW-COST MULTI-CHIP MODULE APPLICATIONS, which is a Continuation of U.S. patent application Ser. No. 18/092,647, filed Jan. 3, 2023, entitled CHIPLET GEARBOX FOR LOW-COST MULTI-CHIP MODULE APPLICATIONS, now U.S. Pat. No. 11,841,815, which is a Non-Provisional that claims priority to U.S. Provisional Application No. 63/295,524, filed Dec. 31, 2021, entitled INNOVATIVE LOW-COST PACKAGING SOLUTIONS FOR SYSTEM IN PACKAGE AND THE HBM CROSSOVER PHY ARCHITECTURE, U.S. Provisional Application No. 63/296,162, filed Jan. 4, 2022, entitled AN EFFICIENT GEARBOX ARCHITECTURE FOR CONVERSION OF HBM PHY INTERFACE TO A SIMULTANEOUS BIDIRECTIONAL PHY, and U.S. Provisional Application No. 63/341,897, filed May 13, 2022, entitled SIMULTANEOUS MEMORY READ AND WRITE FOR HIGHER BEACHFRONT BANDWIDTH EFFICIENCY, all of which are incorporated herein by reference in their entirety.

TECHNICAL FIELD

The disclosure herein relates to semiconductor devices, packaging and associated methods.

BACKGROUND

As integrated circuit (IC) chips such as system on chips (SoCs) become larger, the yields realized in manufacturing the chips become smaller. Decreasing yields for larger chips increases overall costs for chip manufacturers. To address the yield problem, chiplet architectures have been proposed that favor a modular approach to SoCs. The solution employs smaller sub-processing chips, each containing a well-defined subset of functionality. Chiplets thus allow for dividing a complex design, such as a high-end processor or networking chip, into several small die instead of one large monolithic die.

While beneficial in improving the yield issue for larger die, chiplet-based architectures for multi-chip modules (MCMs) often employ costly packaging components and associated processes.

BRIEF DESCRIPTION OF THE DRAWINGS

Embodiments of the disclosure are illustrated by way of example, and not by way of limitation, in the figures of the accompanying drawings and in which like reference numerals refer to similar elements and in which:

FIG. 1 illustrates a high-level embodiment of a multi-chip module (MCM), including a first integrated circuit (IC) chiplet in communication with a third chiplet via a gearbox chiplet.

FIG. 2 illustrates a Table showing one embodiment of a High Bandwidth Memory (HBM) interface pinout.

FIG. 3 illustrates one embodiment of a gearbox chiplet of FIG. 1.

FIG. 6 illustrates one embodiment of an HBM pinout that is similar to FIG. 2, and showing the directional flow of the signals.

FIG. 8 illustrates one embodiment of an input/output (I/O) architecture for a simultaneous bidirectional link used in the systems of FIGS. 7A and 7B.

FIG. 10 illustrates one embodiment of an MCM that shows a variety of optional interface configurations for use in an HBM memory environment.

FIG. 11 illustrates one specific embodiment of an MCM that incorporates one of the optional HBM interface configurations of FIG. 10.

FIG. 14 illustrates one embodiment of an HBM3 pinout table that correlates signals provided by the HBM3 interface to the first/second gearbox circuits.

FIG. 15 illustrates a pinout table similar to that of FIG. 14, but in an HBM4 context.

DETAILED DESCRIPTION

Figure 4:
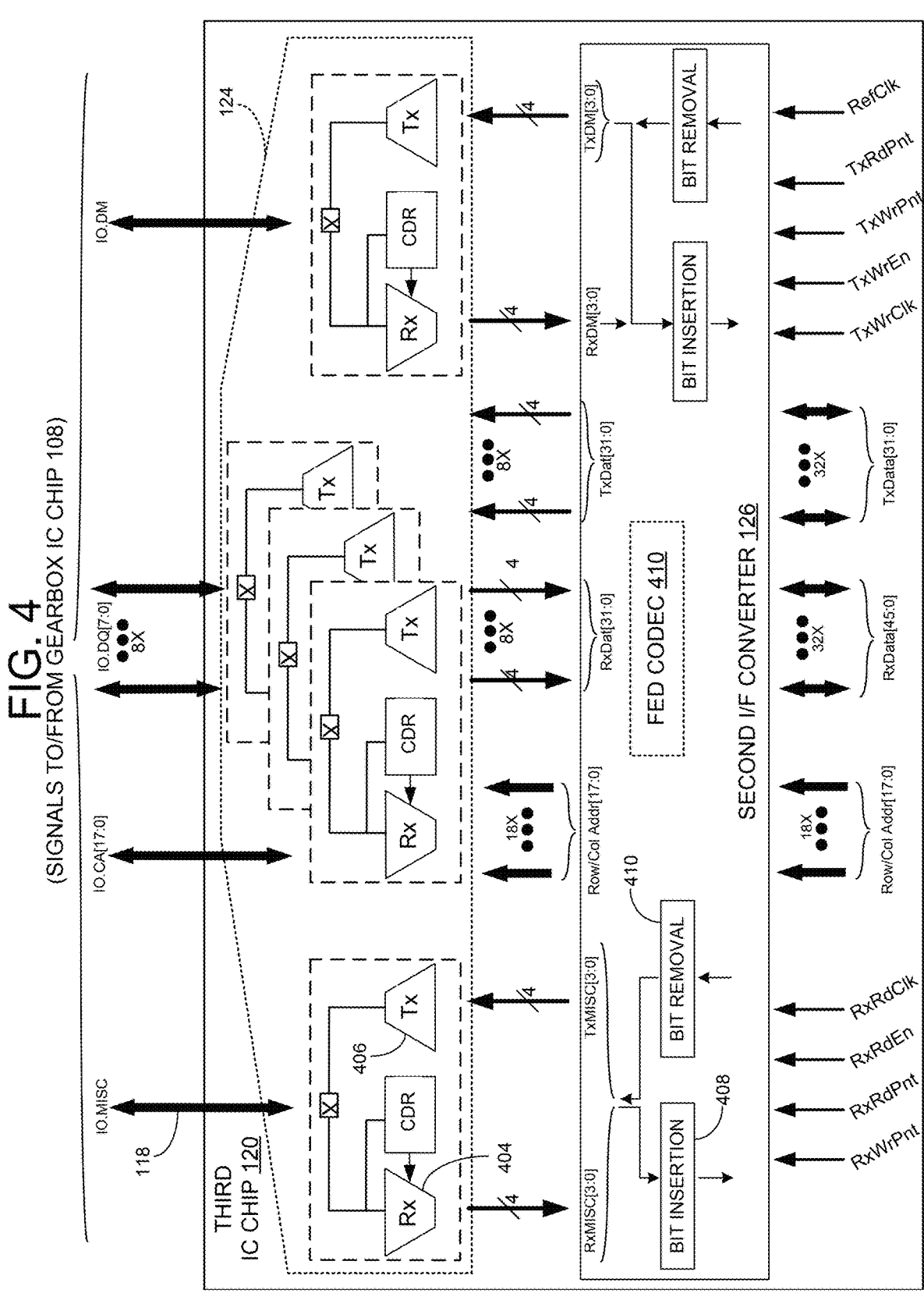
FIG. 4 illustrates one embodiment of the third chiplet of FIG. 1.

Semiconductor devices, packaging architectures and associated methods are disclosed. In one embodiment, a multi-chip module (MCM) is disclosed. The multi-chip module (MCM) includes a first integrated circuit (IC) chip including a first interface defining a first number of interface contacts. Conversion circuitry receives a first set of information-carrying signals associated with a memory access operation. The conversion circuitry generates a second set of non-information-carrying signals associated with the memory access operation and aggregates the second set of non-information-carrying signals with the first set of information-carrying signals to generate an aggregate set of signals. A second interface transmits the aggregate set of signals. Memory, including a memory interface coupled to the second interface of the first IC chiplet, receives the aggregate set of signals.

Throughout the disclosure provided herein, the term multi-chip module (MCM) is used to represent a semiconductor device that incorporates multiple semiconductor die or sub-packages in a single unitary package. An MCM may also be referred to as a system in a package (SiP). With reference to FIG. 1, a block diagram of one embodiment of a multi-chip module (MCM) is shown, generally designated 100. For one embodiment, the MCM includes a package substrate (not shown) that forms a support surface for multiple integrated circuit (IC) chips, or chiplets, including a first IC chip 102, a second IC chip 108 and a third IC chip 120. For some applications, the package substrate takes the form of a low-cost non-silicon substrate.

With continued reference to FIG. 1, for one embodiment the first IC chip 102 takes the form of an IC memory device, such as a volatile dynamic random access memory (DRAM) device or a non-volatile Flash memory device. For one specific embodiment, the first chiplet takes the form of a DRAM memory device compliant with the High Bandwidth Memory (HBM) architecture. For HBM-related embodiments, the first IC chip may take the form of a logic interface chip or a bottom-most DRAM memory chip of a stack of memory chips. The first IC chip 102 includes an electrical interface, such as a memory interface 104 having various input/output (I/O) circuits (not shown) for communicating with other IC devices. The memory interface 104 couples to a mechanical interface in the form of an array of contacts 106, often referred to as bumps that electrically connect to one or more other corresponding bumps of a different device.

For one specific embodiment, and further referring to FIG. 1, the array of bumps 106 employed by the first IC chip are arranged in a manner that is compliant with the given signaling standard associated with the device. As an example, the HBM standard supports sixteen memory channels, with one-hundred twenty pins or I/O paths dedicated to support each channel. FIG. 2 illustrates a table that shows the various functions, number of bumps, and signal identifiers for each of the signals associated with a single channel of an HBM pinout. With sixteen channels, nineteen-hundred twenty bumps are employed in the bump array for an HBM memory device. With surface area and overall footprint constraints, forming almost two-thousand bumps on the surface of an IC memory device for coupling to the required I/O paths is generally accomplished using high-density micro-bump packaging technology. While this packaging technology successfully aggregates micro-bumps at a very high density, associated yield rates and signal integrity limitations may involve additional packaging techniques that may increase cost to the overall multi-chip module 100.

Further referring to FIG. 1, to reduce costs associated in manufacturing the MCM 100, for one embodiment the first IC chip 102 is coupled to a second IC chip 108, referred to herein as a gearbox chiplet. For one embodiment, the gearbox chiplet 108 includes a second bump array 110 that matches the first bump array 106 of the first IC chip 102. For some embodiments, the two bump arrays 106 and 110 may be directly bonded to each other such that the first IC chip 102 and the second IC chip 108 form a stacked or 3.0D configuration for mounting on the package substrate.

In some embodiments, the features of the gearbox chiplet 108 may be employed in a logic interface chip or DRAM memory chip of an HBM memory device. In other embodiments, the first IC chip 102 and the second IC chip 108 may be disposed horizontally to each other in a 2.5D configuration, and coupled to each other via a secondary substrate (not shown) that is mounted on the package substrate. Various embodiments and implementations of the connections between the first chiplet and the second chiplet are shown and described in copending U.S. application Ser. No. 17/973,905, filed Oct. 26, 2022, entitled "Method and Apparatus to Reduce Complexity and Cost for Multi-Chip Modules (MCMs)", assigned to the assignee of the present disclosure and incorporated by reference herein in its entirety.

With continued reference to FIG. 1, the gearbox chiplet 108 includes a first interface converter 112 that generally omits selected signals transferred from the first IC chip 102 in a receive direction to generate a reduced set of signals N, and recreates previously omitted signals in a transmit direction to the first IC chip 102. Serialization circuitry 114 serializes the reduced set of signals in the receive direction by a selected integer divisor M.

Further referring to FIG. 1, the gearbox chiplet 108 includes a third interface bump array 116 that takes advantage of the reduced number of signal paths associated with the serialized set of signals and employs a standard array of bumps that each exhibit a significantly larger size, pitch and overall dimension than the micro-bump array. The use of the low-density standard array bumps improves the reliability of the mechanical interface connections and avoids many of the signal integrity issues associated with high-density microbumps for high-speed applications. Although the standard array bumps are each larger than their micro-bump counterparts, the reduction in paths due to the first pass filtering and the second-pass serialization results in a significant path reduction that is supported by a similarly reduced number of bumps. As a result, the reduced number of larger bumps may be contained within a similar surface area as that dedicated to a much larger set of microbumps.

Further referring to FIG. 1, the reduction in signaling paths, and the use of the sparser standard array of bumps allows for the use of high-speed links, such as at 118, routed along the non-silicon substrate and for coupling the gearbox chiplet 108 to the third chiplet 120. For some embodiments, the links are high-speed short or long reach links that provide bandwidth capabilities that are similar to links incorporated by silicon substrates. For some embodiments, the links may take the form of unidirectional or bidirectional signaling links that may simultaneously communicate in both upstream and downstream directions. Further detail associated with one embodiment of a simultaneous bidirectional link is provided below.

With continued reference to FIG. 1, the third chiplet 120 includes a fourth interface bump array 122 that takes advantage of the serialized set of signals transferred along the high-speed links 118, and employs a second standard array of bumps that substantially matches the third interface array of bumps 116 formed on the gearbox chiplet 108. For the receive direction, the third IC chip 120 employs the deserialization circuitry 124 to convert the serialized signals from the high-speed links 118 back to a reduced parallel set of signals corresponding to the pre-serialized signals received by the gearbox chiplet 108. The second interface converter 126 then recreates and inserts bits corresponding to the omitted bits that were filtered by the gearbox chiplet 108 to re-form the full set of signals transmitted by the first IC chip 102. The full set of signals may then be fed to core circuitry 128 of the third IC chip 120. For HBM memory embodiments, the third IC chip 120 may take the form of a host chip or application specific integrated circuit (ASIC) processing chip that acts as a master chip with respect to the HBM memory chip (the first IC chip 102).

Figure 3:
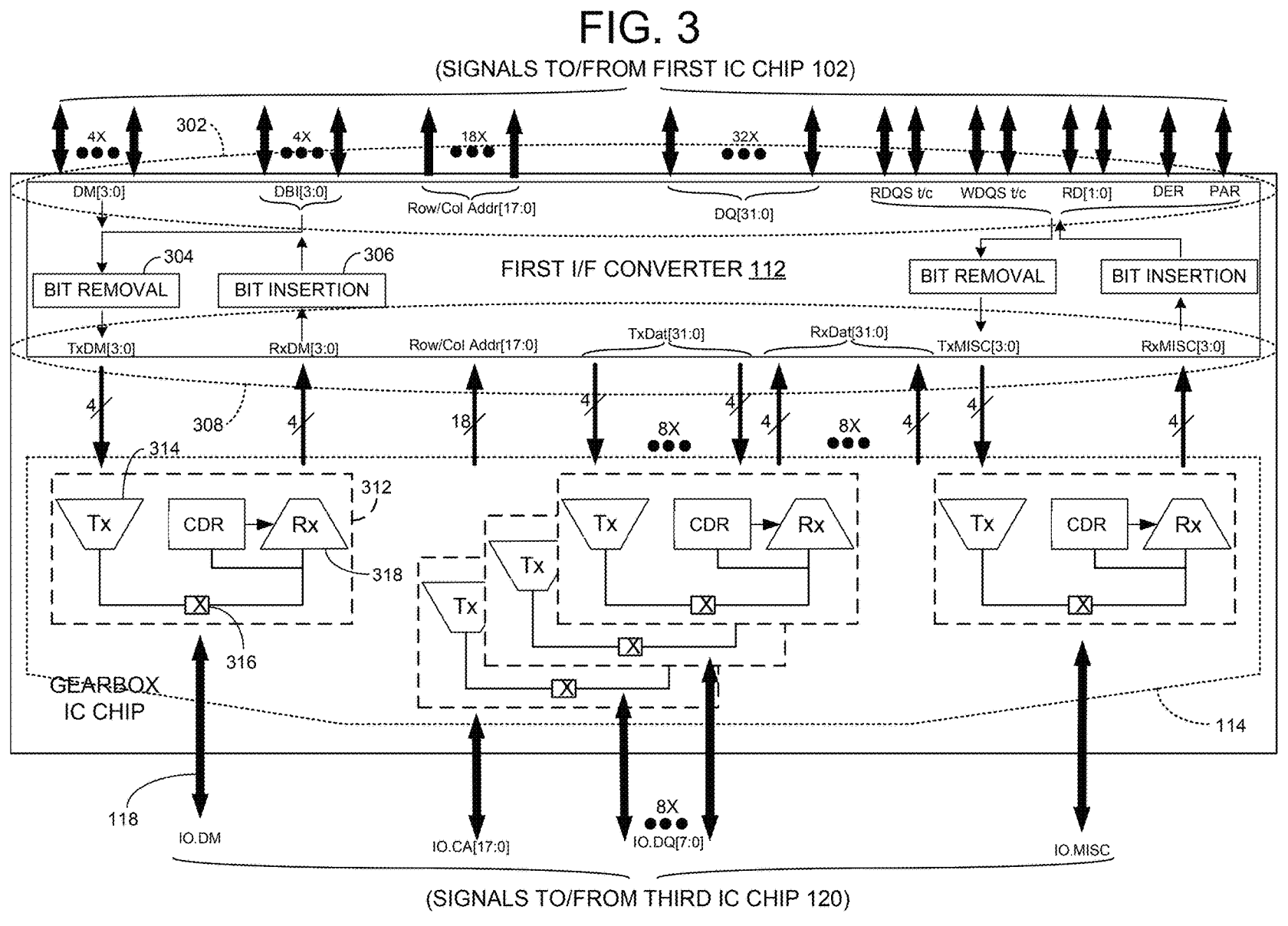

FIG. 3 illustrates further detail associated with one embodiment of the gearbox chip 108 of FIG. 1. The first interface converter 112 includes a first signal interface 302 that couples to the micro-bump array 106 of the first IC chip 102. For one specific HBM embodiment, the first signal interface reflects a full HBM memory interface, including sixty-four transmit data bits TxDQ and receive data bits RxDQ, and various command/address signals such as datamask DM, data bus inversion (DBI), read/write strobes RDQS/WDQS, row and column address bits, and others. In a receive direction, the first interface converter 112 employs bit removal circuitry 304 that selectively omits certain signals (when received from the HBM interface) to carry out a first-pass signal path reduction. In a transmit direction (for signals transmitted to the HBM interface), the first interface converter 112 includes bit insertion circuitry 306 to selectively recreate signals that were omitted in the receive direction. For one specific embodiment, and referring to FIG. 2, signal paths dedicated to the data bus inversion (DBI) function may be omitted via the bit removal circuitry 304, as well as redundant data paths, redundant address paths, and reserved for future use (RFU) paths. Additionally, several strobe paths (RDQS and WDQS) may be omitted. The effect of the first-pass signal path reduction may reduce the HBM path count, in a receive direction, from one-hundred twenty paths per channel to, for example, one-hundred paths per channel. With sixteen channels, the reduction in overall signaling paths reduces from nineteen-hundred twenty paths to sixteen-hundred paths. This per-channel path reduction is reflected in a second signaling interface 308 of the first interface converter 112.

Further referring to FIG. 3, the second signaling interface 308 of the first interface converter 112 is coupled to the first serialization/deserialization (SerDes) circuitry 114. The SerDes circuitry 114 includes multiple SerDes transceivers 312, each including a multiplexing transmitter 314 coupled to an input/output (I/O) pin 316, and a demultiplexing receiver 318 coupled to the pin 316. Each pin 316 couples to a given one of the high-speed links 118. For one embodiment, the multiplexing transmitters 314 may be configured to time-multiplex various incoming parallel signals into a serial stream of signals via a predetermined conversion ratio (such as 2:1, 3:1, 4:1, etc.) for transmission along the given link 118. This time-multiplexing feature provides a second-pass signal path reduction to further reduce the number of signal paths proportional to the conversion ratio. In an opposite signaling direction, the demultiplexing receivers 318 may be configured to demultiplex a serialized stream of signals into multiple parallel signals.

With continued reference to FIG. 3, for one embodiment, the high-speed links 118 are configured as simultaneous bidirectional links, that are each capable of simultaneously transmitting and receiving data via the SerDes circuitry 114. The use of the simultaneous bidirectional links provides a further technique to reduce the number of signal paths in the receive direction. A hybrid circuit (not shown) manages transmission and reception of data for transfer via each of the simultaneous bidirectional links 118. Other embodiments and associated details for various interface adapter chiplet configurations are described in U.S. patent application Ser. No. 16/812,234, titled "LOW COST SOLUTION FOR 2.5D AND 3D PACKAGING USING USR CHIPLETS", filed Mar. 6, 2020, assigned to the Assignee of the instant application, and incorporated by reference in its entirety.

FIG. 4 illustrates further detail associated with one embodiment of the third IC chip 120 of FIG. 1. Generally, the third IC chip 120 includes interface circuitry that is the inverse of the gearbox chiplet 108. The third IC chip 120 employs the second SerDes interface 124 that couples to the high-speed links 118. The second SerDes interface 124 is formed similar to the first SerDes interface 114 of the gearbox chiplet 108, with demultiplexing receivers 404 to convert serial signal streams to parallel signals, and multiplexing transmitters 406 to convert parallel signals to serialized signals. The second interface converter 126 couples to the second SerDes interface 124 and includes second bit insertion circuitry 408 to recreate the signals that were omitted by the first interface converter 112 of the gearbox chiplet 108. Second bit removal circuitry 410 omits selected signals for destination to the first IC chip 102.

For one embodiment, the third IC chip 120 employs a forward error correction coder/decoder (FEC CODEC) 410 to provide error correction capability for bits stored in the memory, and those in transit via communications, thus improving the bit error rate (BER) of communications between the first IC chip 102, the gearbox chiplet 108 and the third IC chip 120. In certain embodiments, the FEC CODEC provides improved error correction capability without adding to the overhead of the memory channels. For one specific embodiment, instead of utilizing only a parity bit for every thirty-two bits of data, an FEC code is employed. In one embodiment, a Reed-Solomon code may be used to protect signals running at full speed, such as data DQ, error code signals ECC and SEV, which for an HBM embodiment total seventy-two signals. Since the ECC bits can be part of the FEC overhead, only sixty-eight signals need to be error protected. In an effort to generate a code having a relatively short frame size (to reduce latency), and exhibit a minimum overhead (such as coding circuitry overhead and/or bump size), one embodiment uses an RS code RS (72,68,8), which corrects two erroneous 8-bit words out of seventy-four words. To support this code, four ECC bits are utilized. In some embodiments, where a thirty-two bit sub-channel is used, the remaining thirty-two bit positions may be filled with known bits, such as all "0s", or a given pattern such as 00001111. In such circumstances, sixty-four bits are still transferred, but with a relatively low bit toggling rate that consumes less power and results in a significantly lower error rate and which assists in the recovery of the actual thirty-two bits being transferred.

Figure 5:
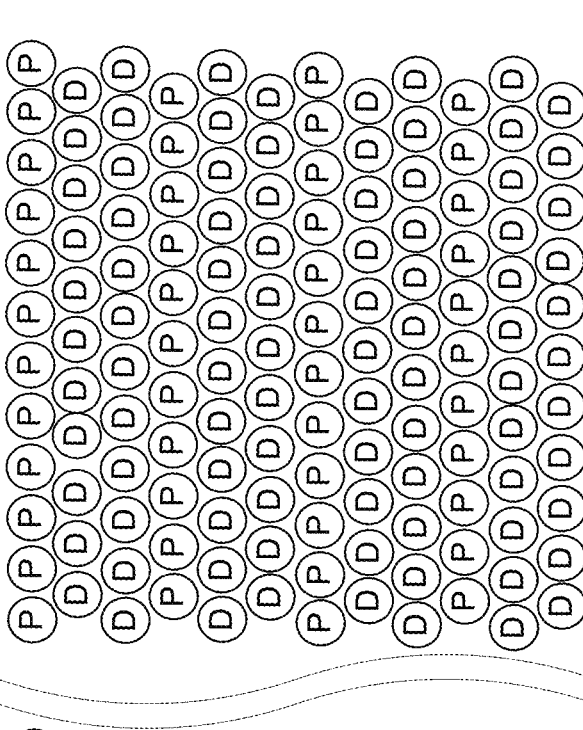
FIG. 5 illustrates an embodiment of a bump architecture for use with the gearbox chiplet of FIG. 3 and the third chiplet of FIG. 4.

For one embodiment, and referring now to FIG. 5, the bump array pattern employed by the gearbox chiplet 108 to communicate with the third IC chip 120 employs a layout architecture that optimizes the number of bump contacts associated with a given gearbox conversion ratio for the available chiplet surface area. For one specific embodiment where the gearbox chiplet 108 utilizes a 3:1 conversion ratio, a bump pattern of DDPDDPDDPDDP is employed, with "P" bumps representing power/ground contacts, and "D" representing data contacts. For one specific embodiment, constraints used in supporting the bump pattern include limiting the dimensions of the gearbox chiplet 108 first signaling interface 110 (FIG. 1) to be no larger than the HBM interface 106, and targeting a bump pitch of 130 micrometers, an X dimension bump spacing of 65 micrometers, and a Y dimension bump spacing of 112.6 micrometers. For different conversion ratios, the bump pitches and X and Y bump spacings may be larger or smaller, depending on the conversion ratio and application.

FIG. 6 illustrates a further embodiment of a Table pinout for an HBM memory device, similar to Table 1 of FIG. 2, but showing respective input and/or output directions for each of the signals. For example, data signals including read data and write data, are generally bidirectional in nature and may be received by the memory device (in the case of write data), or transmitted by the memory device (in the case of read data). Various command and address signals, however, are generally unidirectional in nature. For some embodiments, simultaneous bidirectional links may be used to couple a memory device to a memory controller, with certain of the unidirectional command/address signal paths reused for read data signals to either further reduce the number of bumps or to increase the read bandwidth of the system.

Figure 7A:
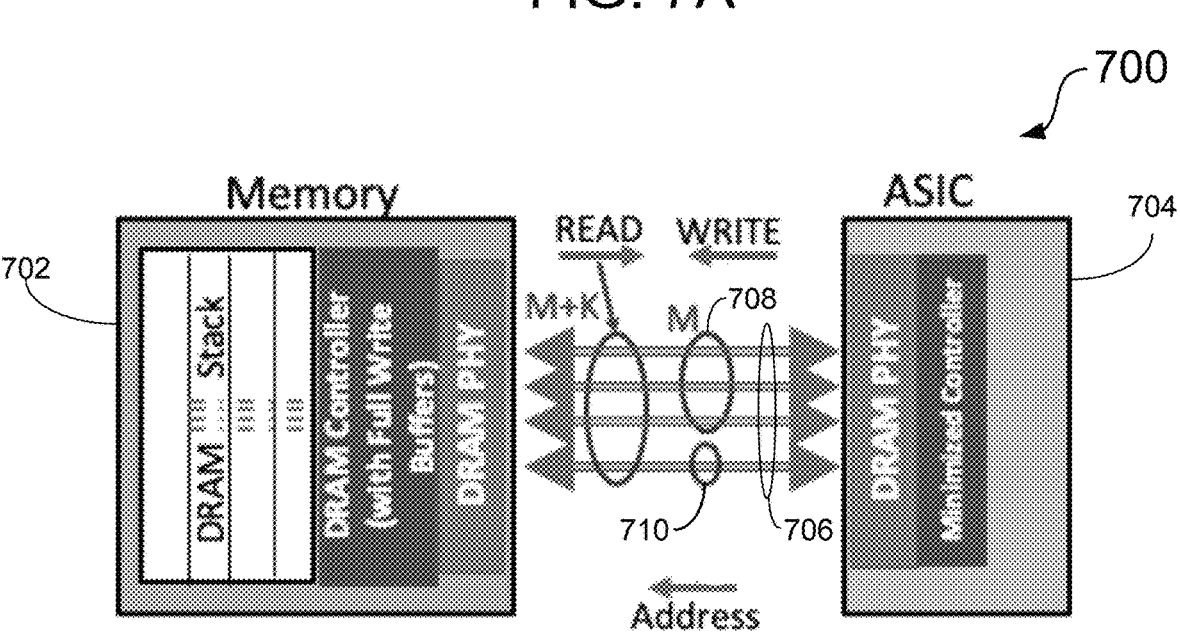
FIGS. 7A and 7B illustrate high-level memory system architectures that employ simultaneous bidirectional links.

FIG. 7A illustrates one embodiment of a memory system 700, including a memory device 702 coupled to a host memory controller 704 via a set of simultaneous bidirectional links 706. In a write direction, a first sub-set 708 of the links 706 may be employed for write data transfers, while a second subset 710 of the links 706 may be used for transferring command/address (C/A) signals from the controller 704 to the memory device 702. In a read direction, all of the links may be used to transfer read data simultaneous with the transfer of the write data and C/A signals. Consequently, in this embodiment, the read bandwidth is higher than the write bandwidth due to the availability of the extra sub-set of links for read data transmissions.

Figure 7B:
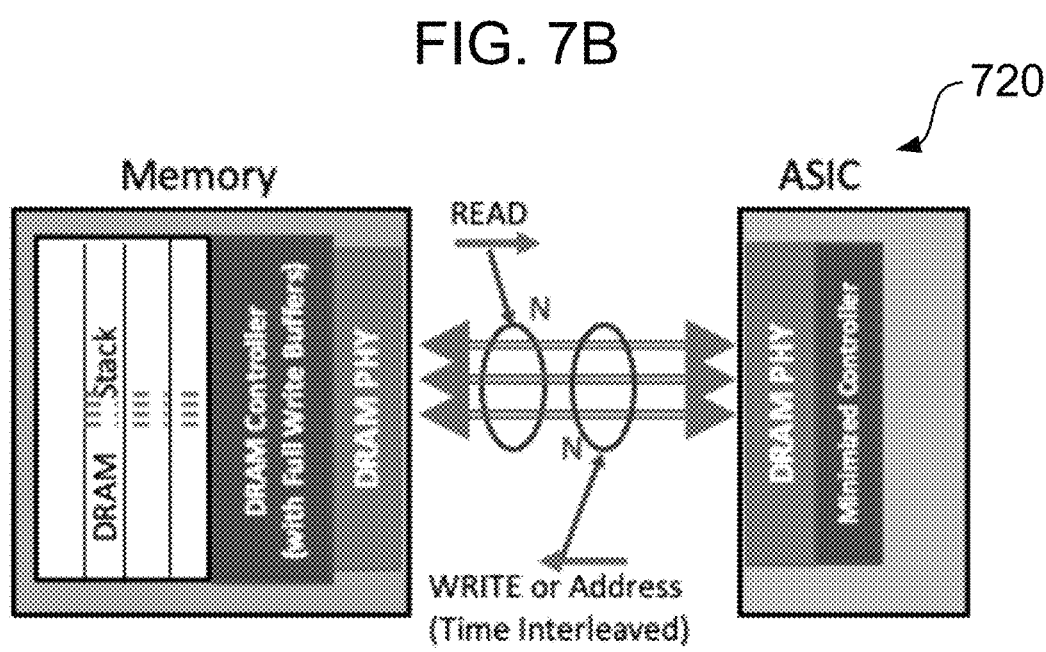

FIG. 7B illustrates an alternative embodiment of a memory system 720 that uses simultaneous bidirectional links, but with a reduced set of links in comparison to the system 700 of FIG. 7A. Rather than using sub-sets of links for the write direction, the embodiment of FIG. 7B time-multiplexes the command/address signals with write data along a full width of the links, and uses the same full width for read data transfers simultaneously with the transfers of the write data and C/A signals.

Figure 8:
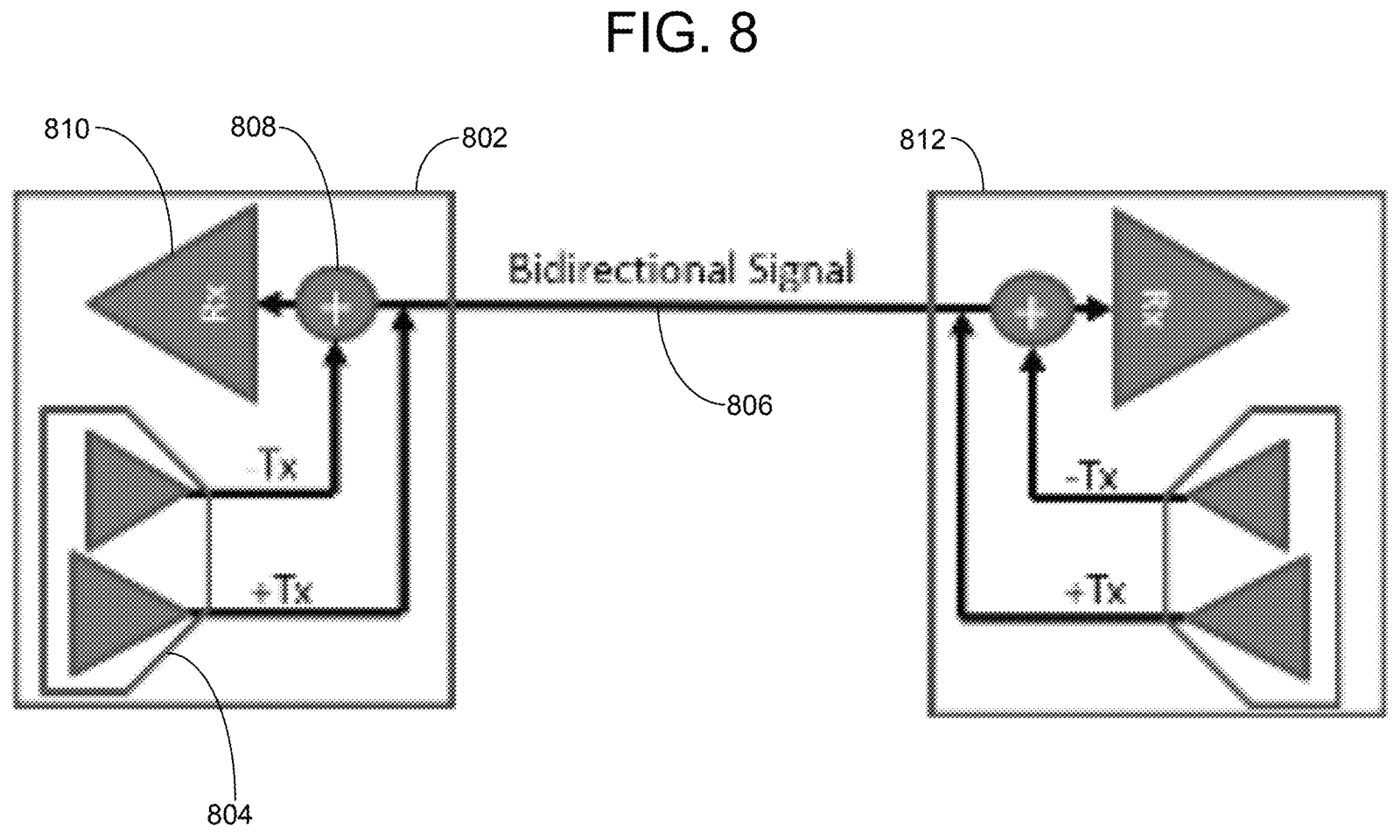

FIG. 8 illustrates one embodiment of a simultaneous bidirectional link 800 that may be used in the memory systems and MCM architectures described above. A first simultaneous bidirectional input/output (I/O) circuit 802 includes transmit circuitry 804 that transmits data to a link 806 and complement data to a summer 808. Receiver circuitry 810 receives data sent from a link partner I/O circuit 812 that has been summed with the complement data sent by the transmit circuitry 804, essentially cancelling any reflected transmit data signals that may be included in the receive data. The link partner I/O circuit 812 also includes transmit and receive circuitry similar to that of the local I/O circuitry.

For some embodiments, the conversion/reconversion circuitry at each end of a given link between two gearbox circuits (or chiplets) may be similar, but non-matching in the sense that one gearbox circuit may communicate with circuitry that benefits from a more full-featured set of signals than the other gearbox circuit. As an example, in a High Bandwidth Memory (HBM) context, a first conversion/reconversion circuit (or gearbox) may be formed in a silicon process that may be tailored for high-performance logic, with state-of-the art feature sizes (process nodes) that may readily support sophisticated signaling techniques with a reduced need for support signals that often utilize accompanying signal paths and corresponding I/O circuitry. At the other end of the link, the second conversion/reconversion circuit may be formed in a silicon process that may not be as advanced, or tailored for a slower architecture, such as for a memory device, that may benefit from additional support signals to, for example, maintain adequate timing margin for data transfers to and from the memory device.

Figure 9:
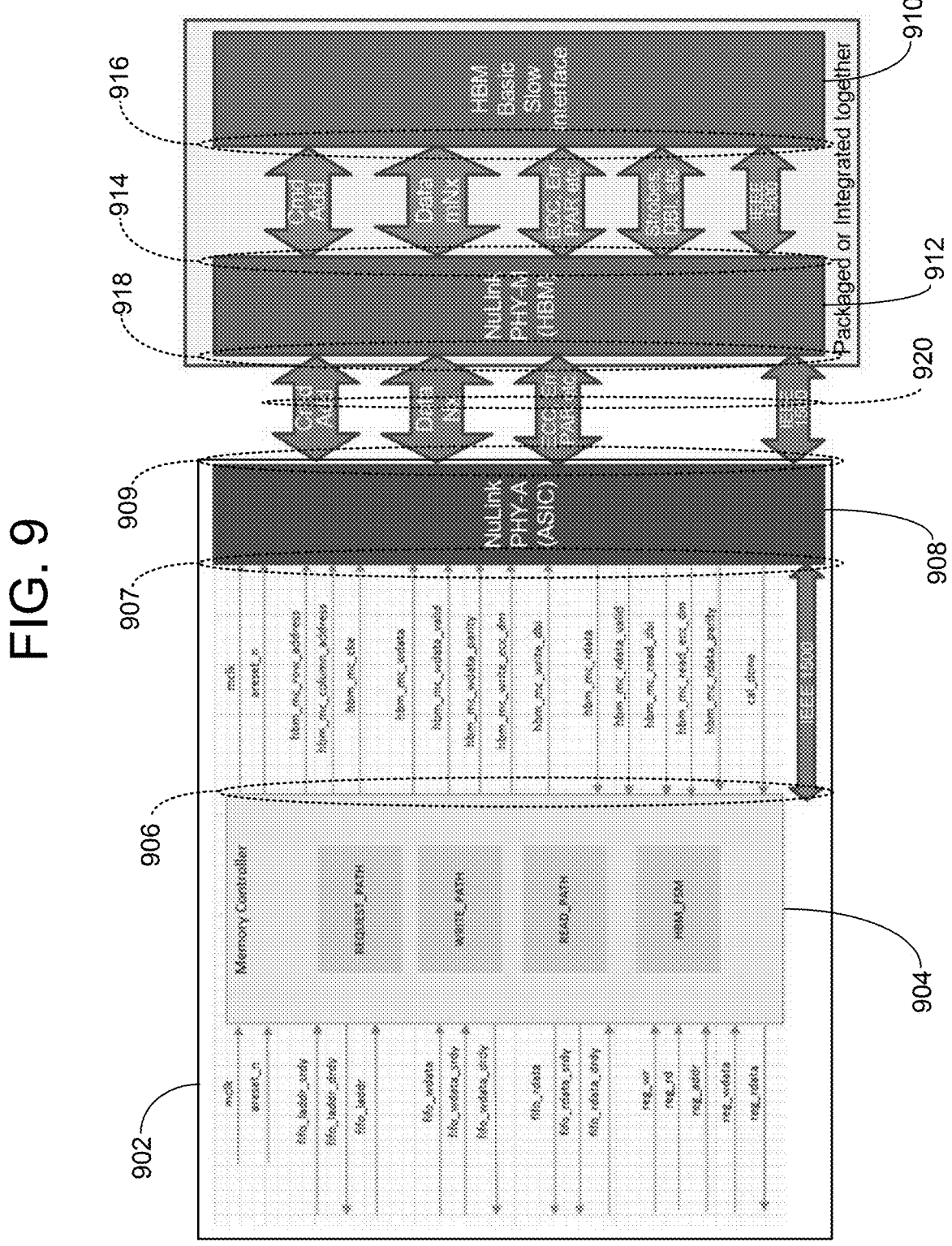
FIG. 9 illustrates one specific example of circuitry for an HBM architecture with non-matching gearbox interfaces.

FIG. 9 illustrates one specific example of non-matching gearbox interfaces in an HBM context. A portion of an application-specific integrated circuit (ASIC) 902 includes an HBM memory controller circuit 904 that includes a memory interface 906 with a first set of signal paths that couple to a primary interface 907 of a first gearbox circuit 908. As shown in subsequent figures, and more fully described below, the first gearbox circuit 908 may take the form of circuitry in the ASIC 902 itself, or take the form of a discrete chiplet that is coupled to the memory interface 906. Since the ASIC side of the signaling channel is generally formed from advanced process node technology, the set of signals associated with the ASIC that are converted/reconverted and transferred by the first gearbox circuit 908 along a first secondary interface 909 may be more data focused, and referred to herein as information-carrying signals. Support signals, such as timing signals, may be embedded in and/or derived from the data or otherwise obtained without relying on accompanying source-synchronous timing signals such as strobe or data clock signals. Similar support signals that may not be included in the ASIC side set of signals fed to the first gearbox circuit 908 include data bus inversion (DBI) signals. The support signals may be referred to herein as non-information-carrying signals. The first gearbox circuit 908 generally includes conversion/reconversion circuitry as described above with respect to FIGS. 1-6 to allow for signal transfers between the ASIC 902 and a corresponding HBM memory device 910 to take place on a reduced number of signal paths.

Further referring to FIG. 9, the HBM memory device end of the memory channel includes a second gearbox circuit 912 that includes a second primary interface 914 for communicating with an HBM basic memory interface 916, and a second secondary interface 918 for communicating with the first secondary interface 909 of the first gearbox circuit 908. Since the memory device side of the signaling channel may generally be formed from less-advanced (and less costly) process node technology, the set of signals associated with the memory device 910 that are converted/reconverted and transferred by the second gearbox circuit 912 along the second secondary interface 918 may be more full-featured, where the support signals such as the timing and DBI signals may need to be recreated to maintain adequate timing constraints associated with the memory device 910. For one embodiment, the support signals are recreated based on information bits received from memory command/address signal paths. Thus, for some embodiments, while the secondary interfaces of the two gearbox circuits 908 and 912 generally match to enable communication along a common link or set of signal paths, such as at 920, the respective primary interfaces 907 and 914 of the two gearbox circuits 908 and 912 may be slightly non-matching, based on the existence or lack of the support signals such as those described above.

Figure 12:
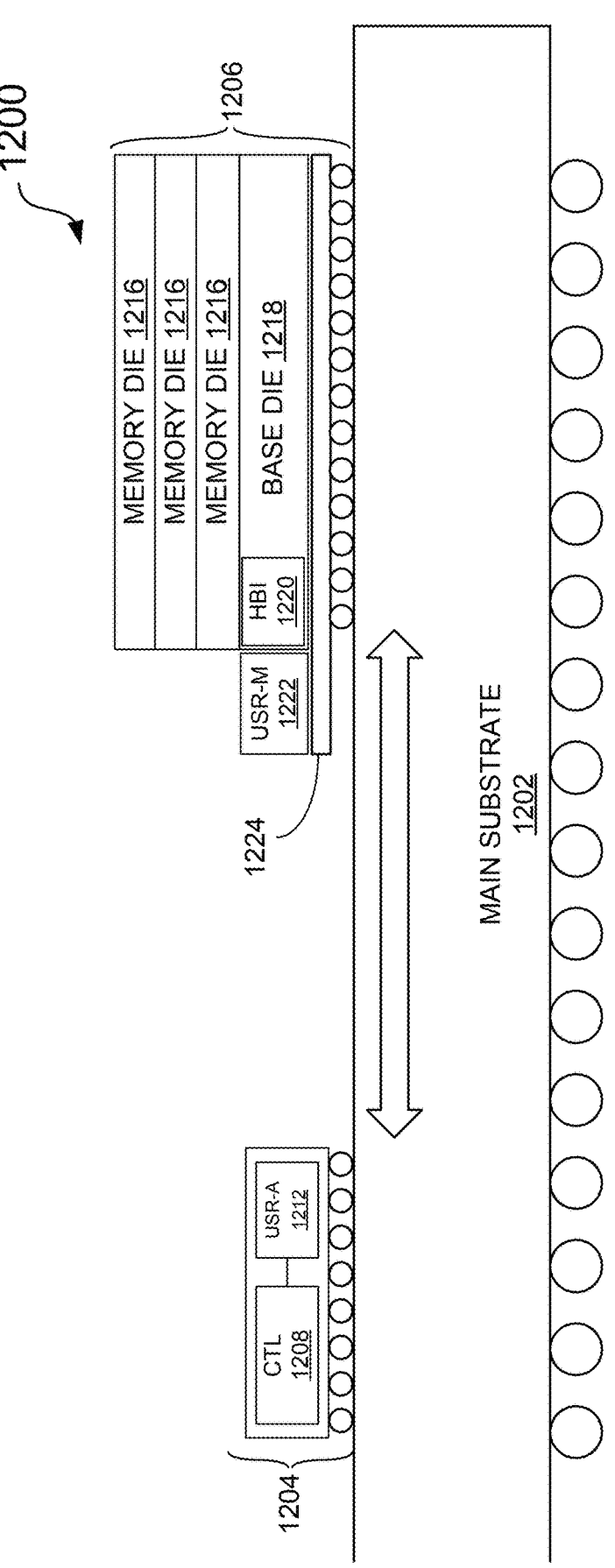
FIG. 12 illustrates a further specific embodiment of an MCM that incorporates another of the optional HBM interface configurations of FIG. 10.
Figure 13:
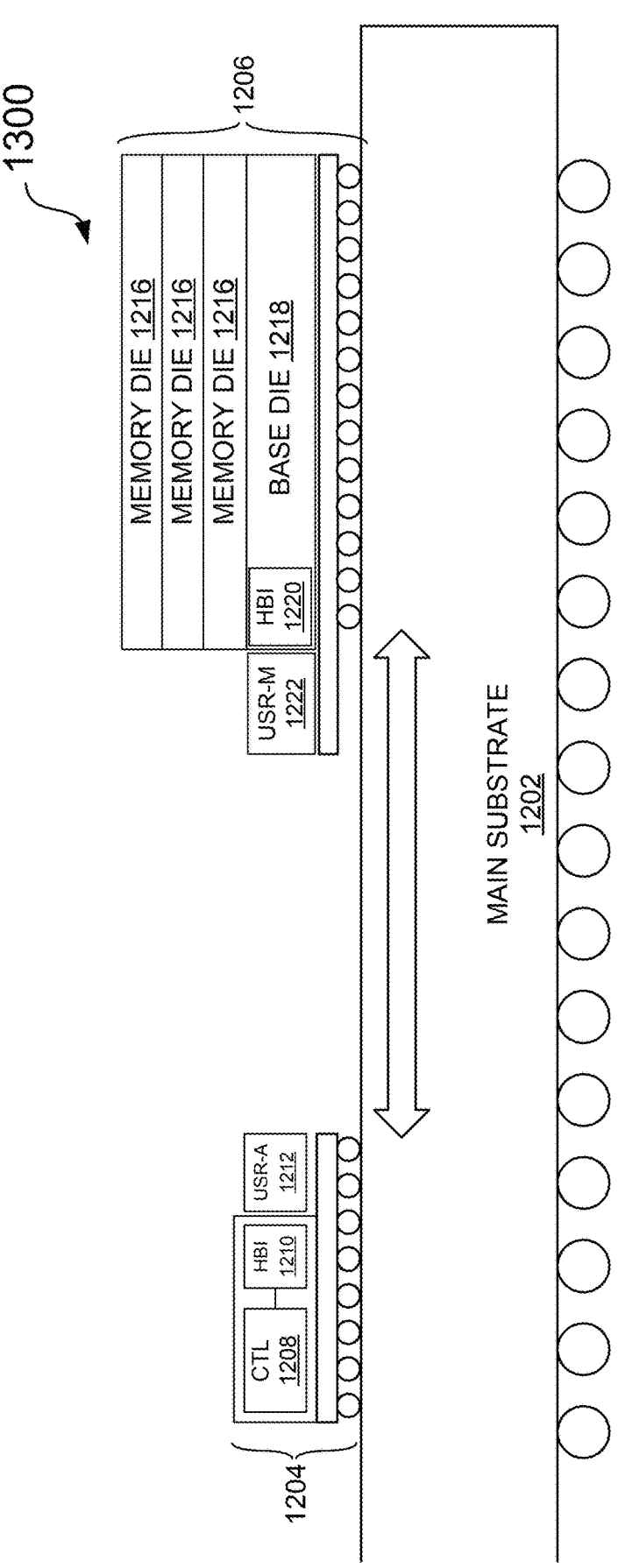
FIG. 13 illustrates an additional specific embodiment of an MCM that incorporates another of the optional HBM interface configurations of FIG. 10.

FIG. 10 illustrates an MCM 1000 with a configurable topology that corresponds to the general HBM architecture of FIG. 9, but with optional (shown in phantom) implementations of the gearbox circuits (identified as USR-A for an ASIC-side interface, and USR-M for a memory-side interface). Specific embodiments of the optional topology features are shown in FIGS. 11-13.

Further referring to FIG. 10, the MCM 1000 includes a main substrate 1202 that may be formed of a non-silicon organic material to mount a first processing device, such as an ASIC device 1204, and at least one HBM memory device 1206. The ASIC device 1204 generally includes an HBM memory controller 1208 that optionally includes a standard HBM interface that is often referred to as a high-bandwidth interface (HBI) 1210 formed on the ASIC chip. Depending on the application, a USR-A gearbox circuit 1212 is provided to either interface with the memory controller 1208 directly (without the HBI interface 1210) or to interface with the HBI interface 1210. The USR-A gearbox circuit 1212 may either be formed on the ASIC device 1204, or take the form of a discrete gearbox chiplet that is packaged with the ASIC device 1204 and disposed on a secondary package substrate 1214 with the ASIC chip 1204.

With continued reference to FIG. 10, the HBM memory device 1206 generally includes one or more memory die 1216 that are vertically stacked with a logic base die 1218. The logic base die 1218 may or may not include an HBI interface circuit 1220. A USR-M gearbox circuit 1222 interfaces with the logic base die 1218 (either directly or through the HBI interface circuit 1220) and may either be formed on the logic base die 1218, or take the form of a discrete gearbox chiplet that is packaged with the logic base die 1218 and disposed on a secondary package substrate 1224 with the logic base die 1218.

FIG. 11 illustrates the specific optional topology of FIG. 10, generally designated 1300, where the two gearbox circuits USR-A 1212 and USR-M 1222 are formed in the ASIC 1204 and logic base die 1218, respectively. Also, for the embodiment of FIG. 13, full HBI interfaces 1210 and 1220 are not included in the ASIC 1204 or the memory device 1206. In one embodiment, the logic base die 1218 of the memory device 1206 incorporates a basic low-speed interface (not shown) that couples to the USR-M gearbox 1222.

FIG. 12 illustrates the specific optional topology of FIG. 10, generally designated 1400, where the first gearbox circuit USR-A 1212 is formed in the ASIC 1204, while the second gearbox circuit USR-M 1222 takes the form of a discrete chiplet and is packaged with the logic base die 1218 using the secondary substrate 1224. For this particular embodiment, an HBI interface 1220 is included in the logic base die 1218, but excluded from the ASIC 1204.

FIG. 13 illustrates an optional topology of FIG. 10, generally designated 1500, which incorporates both a first HBI interface 1210 and a discrete gearbox chiplet interface 1212 at the ASIC end, and a second HBI interface 1220 and a second discrete gearbox chiplet interface 1222 at the memory device end.

In a further embodiment, the number of signal paths between the gearbox circuits may be further reduced by sharing certain signals associated with a first signaling channel with a second signaling channel. Specifically, and referring now to FIG. 14, command/address (C/A) and parity signals provided by the HBM3 standard, at 1402, are specified to run at a signaling rate of 16 Gbps, which is half the full rate of 32 Gbps. By serializing the HBM C/A and parity signals down to five signaling paths, and communicating those signals at 32 Gbps instead of 16 Gbps, the bandwidth needed to provide the command/address and parity signals for two channels over the same number of connections may be realized.

FIG. 15 illustrates a pinout table for the HBM4 standard, which provides about twice the number of C/A and parity signals, but for two channels. The multi-channel architecture of HBM4 thus allows it to take advantage of the C/A and parity signal sharing technique described above. With HBM4, however, undetected errors in the C/A signals should be kept to a minimum. To significantly reduce the chances of double or multiple errors in the C/A signals running at 16 Gbps, one embodiment allocates two parity bits for devices compliant with the HBM3 standard, and four parity bits for devices running at 32 Gbps that are compliant with the HBM4 standard.

By employing one or more of the above sharing techniques, all standards-compliant information may be communicated between the ASIC and HBM memory device within an approximate 10 mm beachfront over a standard package with a buildup substrate stackup of 8-2-8 and a bump pitch of 110 micrometers. Keeping the HBM PHY beachfront at or under 10 mm is desirable to fit that within the form factor of the HBM module with only an 11 mm beachfront, which needs 0.5 mm on either side for power/ground bumps. It also allows fitting at least three HBM PHYs on the long edge of a reticle size ASIC (32 mm).

As described above, a standard HBI interface generally receives a variety of signals from a memory controller, and converts the signals to an HBI-compliant set of signals.

Columns 1404 (FIG. 14) and 1502 (FIG. 15) of the tables of FIGS. 14 and 15 show pinout listings of respective HBM3-related and HBM4-related embodiments of such signals. The HBI interface, such as at 1210 of FIG. 13, generates a number of signals like Strobes and data bus inversion (DBI) signals in order to talk to the HBI interface in the HBM, such as at 1220 of FIG. 13. These additional signals are employed because the PHY on the memory has historically been much simpler, and thus needs extra support signals to adequately process high-speed Read and Write memory operations. This is typically due to the memory using slower silicon node processes and devices, and using minimal circuitry to reduce power consumption and so forth.

When more advanced (faster) silicon is used as the base die of the HBM, the interface circuitry on the memory side (such as USR-M 1222, FIG. 12) can use more advanced circuitry. This allows the interface circuitry to communicate the information-carrying bits between the ASIC 1204 and HBM 1206 at a higher data rate, by muxing and demuxing multiple signals/bits into one high-speed signal. For example, if a 4:1 multiplexer and a 1:4 demultiplexer are used, the signals between the USR-A interface 1212 and the USR-M interface 1222 run at four-times the speed of the standards-compliant HBI signal, and the circuitry can reduce the number of connections by a factor of four. The tables of FIGS. 14 and 15 show the number of signals corresponding to HBM3 and HBM4, at 1406 and 1504, respectively.

In addition, having the ability to employ more complex interfaces on the ASIC side and the memory side of the channels, the interfaces USR-A 1212 and USR-M 1222 only need to communicate the signals that carry actual information (information-carrying signals such as Data, Command/Address, ECC, Parity, Error, etc) and can eliminate the non-information carrying support signals (such as Strobes, DBI, etc) between the ASIC interface USR-A 1212 and the memory interface USR-M 1222. As a result, the total number of connections or traces between the interfaces USR-A 1212 and USR-M 1222 may be reduced. Eventually, the memory interface USR-M 1222 needs to communicate with the basic interface of the memory stacks, and needs to generate similar support signals (Strobes, DBI, etc) to be able to communicate with the basic slow interface in the memory stack having minimal circuitry. The memory interface USR-M regenerates such signals (like Strobes) based on the information bits received from the CMD/Address lines. The embodiment of FIG. 9, as an example, illustrates this concept in more detail. The signals that are created on the right side of the memory interface USR-M 1222 (like Read/Write Strobes or DBI) don't necessarily exist on the left side of the ASIC interface USR-A 1212, coming from the memory controller. Basically, based on information on the CMD/Address signals, the memory interface USR-M 1222 creates signals such as Read/Write Strobes (which used to be sent from the HBM interface on the ASIC side) to enable simpler Read and Write operations from the memory that expects these signals. The right side of the memory interface USR-M 1222 creates these signals to enable the very simple/minimal transceiver in the memory chip to transmit and/or receive data.

For one embodiment, the USR-M interface 1222 and the HBM basic interface are different blocks sitting in one base die in an advanced process node (where the base die is 3D packaged with an HBM memory stack). In other embodiments, the USR-M interface 1222 and the HBM basic interface sit in different dice.

An additional technique that may be used to reduce the number of connections or traces between the USR-A interface and the USR-M interface is to share the CMD/Address and any of their associated signals like parity (APAR) between two channels. In the HBM PHY standard, the CMD/Address/APAR signals generally operate at a half rate compared to the Data. So if the slower signals communicate at the full rate, an adequate bandwidth is available to provide the CMD/Address/APAR information for two channels over the same number of connections. This technique is used for the case of HBM4, as shown in the table of FIG. 15, where the number of signals is double that of HBM3.

As can be seen in the table of FIG. 14, where twenty bits are used for CMD/Address/APAR, five high-speed signals may be used at 16 Gbps in NuLink3 (used for PHY-A & PHY-M in HBM3), which is half the data rate of 32 Gbps. But in the table of FIG. 15 for HBM4, where forty bits of CMD/Address/APAR are used for two channels, five high-speed signals may be allocated in NuLink4 and run at a full speed of 32 Gbps. At the same time, undetected errors (the fail rate should be extremely low) should be constrained in the CMD/Address information. The HBM PHY standard currently allocates only one parity bit for CMD/Address, which should be adequate given that the maximum data rate is expected to be 4 Gbps. In the NuLink case with four-times the data rate, even for 16 Gbps with BER<1E-20, a single parity bit may not be enough, and a false positive may result in the case of double errors. To significantly reduce the chances of double or multiple errors in the CMD/Address information, two parity bits are allocated in the case of HBM3 with the CMD/Address signals running at 16 Gbps, and four parity bits are allocated in the case of HBM4 with the CMD/Address signals running at 32 Gbps.

Using the above techniques, even in the case of HBM4, all of the standards-compliant information may be communicated between the ASIC and HBM memory within an approximately 10 mm beachfront over a standard package with stack-up of 8-2-8 and bump pitch of 110 um. Keeping the HBM PHY beachfront at or under 10 mm is desirable to fit that within the form factor of the HBM module with only an 11 mm beachfront, which needs 0.5 mm on either side for power/ground bumps. It also allows for fitting at least three HBM PHYs on the long edge of a reticle size ASIC (32 mm).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present disclosure. In some instances, the terminology and symbols may imply specific details that are not required to practice the embodiments described herein. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '$\overline{<signalname>}$') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the disclosure has been described with reference to specific embodiments thereof, it will be evident that various modifications and changes may be made thereto without departing from the broader spirit and scope of the disclosure. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

I claim:

1. A chiplet-based multi-chip module (MCM) to couple to a base substrate, comprising:

a memory chiplet to couple to a package substrate that is separate from the base substrate, the memory chiplet comprising a base die, the base die comprising:

a first interface, the first interface to receive, from an integrated circuit (IC) chiplet, along a set of high speed links routed along the package substrate, information-carrying signals transmitted from the IC chiplet, the information-carrying signals associated with a memory access operation, the memory access operation carried out in response to a minimum set of signals comprising the information-carrying signals and non-information-carrying signals, the information-carrying signals excluding the non-information-carrying signals;

conversion circuitry to generate, on the base die, the non-information-carrying signals, the conversion circuitry to merge the non-information-carrying signals with the information-carrying signals to generate a full set of signals that is compliant with the minimum set of signals to perform the memory access operation;

a second interface to transmit the full set of signals; and a memory stack coupled to the base die, the memory stack comprising a memory interface coupled to the second interface of the base die to receive the full set of signals.

2. The chiplet-based MCM of claim 1, wherein:

the non-information-carrying signals comprise at least one of a data bus inversion signal, a reference clock signal, a write enable signal, a write clock signal, a write strobe signal, or a read strobe signal.

3. The chiplet-based MCM of claim 1, wherein:

the base die comprises first circuitry that is formed in accordance with a first process node; and wherein the memory stack comprises second circuitry formed in accordance with a second process node that is slower than the first process node.

4. The chiplet-based MCM of claim 1, wherein:

the memory stack is vertically mounted on the base die and electrically coupled to the base die by through-silicon-vias (TSVs).

5. The chiplet-based MCM of claim 4, wherein:

the memory stack comprises a high-bandwidth memory (HBM) stack of dynamic random access memory (DRAM).

6. The chiplet-based MCM of claim 1, wherein:

the base die comprises a first input/output (I/O) width that is associated with the first interface, and a second I/O width that is associated with the second interface, the second I/O width being wider than the first I/O width; and the memory stack is electrically coupled to the base die by a set of signaling links that corresponds to the second I/O width.

7. The chiplet-based MCM of claim 6, wherein:

the memory stack is vertically mounted on the base die and electrically coupled to the base die by through-silicon-vias (TSVs).

8. The chiplet-based MCM of claim 7, wherein:

the memory stack comprises a high-bandwidth memory (HBM) stack of dynamic random access memory (DRAM).

9. The chiplet-based MCM of claim 1, wherein:

the first interface receives the information-carrying signals at a first signaling rate; and the second interface transmits the full set of signals at a second signaling rate that is less than the first signaling rate.

10. The chiplet-based MCM of claim 9, wherein:

the first signaling rate is an integer multiple faster than the second signaling rate.

11. A memory chiplet to package with an integrated circuit (IC) chiplet in a same chip package, the memory chiplet comprising:

a base die, the base die comprising:

a first interface to receive information-carrying signals transmitted from the IC chiplet, the information-carrying signals associated with a memory access operation, the memory access operation carried out in response to a minimum set of signals comprising the information-carrying signals and non-information-carrying signals, the information-carrying signals excluding the non-information-carrying signals;

conversion circuitry to generate the non-information-carrying signals associated with the memory access operation, the conversion circuitry to merge the non-information-carrying signals with the information-carrying signals to generate a full set of signals that is compliant with the minimum set of signals to perform the memory access operation;

a second interface to transmit the full set of signals to a memory stack.

12. The memory chiplet of claim 11, wherein:

the non-information-carrying signals comprise at least one of a data bus inversion signal, a reference clock signal, a write enable signal, a write clock signal, a write strobe signal, or a read strobe signal.

13. The memory chiplet of claim 11, wherein:

the first interface, the conversion circuitry, and the second interface are formed in accordance with a first process node; and the memory interface comprises second circuitry formed in accordance with a second process node that is slower than the first process node.

14. The memory chiplet of claim 11, further comprising:

first input/output (I/O) circuitry of a first I/O width that is associated with the first interface; and second I/O circuitry of a second I/O width that is associated with the second interface, the second I/O width being wider than the first I/O width.

15. The memory chiplet of claim 11, wherein:

the first interface receives the information-carrying signals at a first signaling rate; and wherein the second interface transmits the full set of signals at a second signaling rate that is less than the first signaling rate.

16. The memory chiplet of claim 15, wherein:

the first signaling rate is an integer multiple faster than the second signaling rate.

17. A method of operation in a memory chiplet, comprising:

receiving, at a first interface of a base die, information-carrying signals associated with a memory access operation from an integrated circuit (IC) chiplet, the memory access operation carried out in response to a minimum set of signals comprising the information-carrying signals and non-information-carrying signals, the information-carrying signals excluding the non-information-carrying signals;

generating, with conversion circuitry of the base die, the non-information-carrying signals associated with the memory access operation;

merging, with the conversion circuitry of the base die, the non-information-carrying signals with the information-carrying signals to form a full set of signals that is compliant with the minimum set of signals to perform the memory access operation; and transmitting, with a second interface of the base die, the full set of signals to a memory stack.

18. The method of claim 17, wherein:

the generating, with the conversion circuitry of the base die, the non-information-carrying signals comprises generating, with the conversion circuitry of the base die, at least one of a data bus inversion signal, a reference clock signal, a write enable signal, a write clock signal, a write strobe signal, or a read strobe signal.

19. The method of claim 17, wherein:

the receiving, at the first interface of the base die, the information-carrying signals is carried out at a first signaling rate; and the transmitting, with the second interface of the base die, the full set of signals is carried out at a second signaling rate that is less than the first signaling rate.

20. The method of claim 19, wherein:

the first signaling rate is an integer multiple faster than the second signaling rate.

* * * * *